United States Patent
Ueno (10) Patent No.: US 11,522,520 B2
(45) Date of Patent: Dec. 6, 2022

(54) FILTER DEVICE, HIGH-FREQUENCY MODULE, AND COMMUNICATION DEVICE

(71) Applicant: Murata Manufacturing Co., Ltd., Kyoto (JP)

(72) Inventor: Kouichi Ueno, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 265 days.

(21) Appl. No.: 16/582,054

(22) Filed: Sep. 25, 2019

(65) Prior Publication Data

US 2020/0021275 A1    Jan. 16, 2020

Related U.S. Application Data

(63) Continuation of application No. PCT/JP2018/010641, filed on Mar. 16, 2018.

(30) Foreign Application Priority Data

Mar. 31, 2017    (JP) .............................. JP2017-072612

(51) Int. Cl.
*H03H 9/64*         (2006.01)
*H03F 3/24*         (2006.01)
(Continued)

(52) U.S. Cl.
CPC ............. *H03H 9/6483* (2013.01); *H03F 3/24* (2013.01); *H03H 9/02952* (2013.01);
(Continued)

(58) Field of Classification Search
CPC ............. H03H 9/6483; H03H 9/02952; H03H 9/14552; H03H 9/14561; H03H 9/6489;
(Continued)

(56) References Cited

U.S. PATENT DOCUMENTS

2007/0229191 A1    10/2007 Yamaki et al.
2010/0188166 A1*    7/2010 Hara ...................... H03H 9/542
                                                        333/133
(Continued)

FOREIGN PATENT DOCUMENTS

JP        2007-274272 A    10/2007
JP        2009-225198 A    10/2009
(Continued)

OTHER PUBLICATIONS

International Search Report for International Application No. PCT/JP2018/010641 dated Jun. 5, 2018.

(Continued)

*Primary Examiner* — Junpeng Chen
(74) *Attorney, Agent, or Firm* — Pearne & Gordon LLP (57) ABSTRACT

A transmission filter is arranged in a first filter region and has one or more acoustic wave resonators, a plurality of terminal electrodes, and a plurality of wires. A reception filter is arranged in a second filter region and has one or more acoustic wave resonators, a plurality of terminal electrodes, and a plurality of wires. The first filter region and the second filter region are arranged adjacently to each other and have at least sides constituting a pair and opposing to each other. At least either one of the first filter region and the second filter region has no wire extending along one side in a forbidden region that is defined by a width including a terminal electrode nearest to the one side, along the one side and over the one side opposing to the other filter region.

19 Claims, 8 Drawing Sheets

(51) Int. Cl.
*H03H 9/02* (2006.01)
*H03H 9/145* (2006.01)
*H03H 9/72* (2006.01)
*H04B 1/48* (2006.01)

(52) U.S. Cl.
CPC .... *H03H 9/14552* (2013.01); *H03H 9/14561* (2013.01); *H03H 9/6489* (2013.01); *H03H 9/72* (2013.01); *H04B 1/48* (2013.01); *H03F 2200/165* (2013.01); *H03F 2200/171* (2013.01); *H03F 2200/294* (2013.01); *H03F 2200/451* (2013.01)

(58) Field of Classification Search
CPC ............... H03H 9/72; H03F 2200/165; H03F 2200/171; H03F 2200/294; H03F 2200/451; H03F 3/24; H04B 1/48
See application file for complete search history.

(56) References Cited

U.S. PATENT DOCUMENTS

| | | | | |
|---|---|---|---|---|
| 2011/0032051 A1* | 2/2011 | Kawamoto | ............ | H03H 9/725 333/133 |
| 2012/0286895 A1* | 11/2012 | Hara | ................... | H03H 9/6483 333/133 |
| 2012/0300679 A1* | 11/2012 | Tsutsumi | ................. | H04B 1/18 370/278 |
| 2013/0049882 A1* | 2/2013 | Yamashita | ............. | H04B 1/525 333/133 |
| 2013/0141180 A1* | 6/2013 | Uejima | .................... | H04B 1/18 333/26 |
| 2014/0308906 A1* | 10/2014 | Saji | ..................... | H01L 23/5389 455/83 |
| 2014/0342678 A1* | 11/2014 | Khlat | ....................... | H04B 1/44 455/78 |

FOREIGN PATENT DOCUMENTS

| JP | 2013-081118 A | 5/2013 |
|---|---|---|
| JP | 2016-139969 A | 8/2016 |

OTHER PUBLICATIONS

Written Opinion for International Application No. PCT/JP2018/010641 dated Jun. 5, 2018.

* cited by examiner

ISOLATION BETWEEN TRANSMISSION FILTER AND RECEPTION FILTER

FILTER DEVICE, HIGH-FREQUENCY MODULE, AND COMMUNICATION DEVICE

This is a continuation of International Application No. PCT/JP2018/010641 filed on Mar. 16, 2018 which claims priority from Japanese Patent Application No. 2017-072612 filed on Mar. 31, 2017. The contents of these applications are incorporated herein by reference in their entireties.

BACKGROUND OF THE DISCLOSURE

Field of the Disclosure

The present disclosure relates to a filter device, a high-frequency module, and a communication device.

Description of the Related Art

Conventionally, there has been a surface acoustic wave device in which two surface acoustic wave elements are arranged adjacently to each other and a signal path in one element is arranged at a side farther from the other element with respect to the center line of the one element (see Patent Document 1, for example). In the surface acoustic wave device, the signal path in the one element is physically apart from the other element, thereby reducing coupling of signals between the elements.

Patent Document 1: Japanese Unexamined Patent Application Publication No. 2007-274272

BRIEF SUMMARY OF THE DISCLOSURE

In recent years, multiband communication and carrier aggregation communication are widespread, in which communication is performed using radio frequency (RF) signals in a plurality of frequency bands. In high-frequency circuits in which RF signals in multiple frequency bands are processed, when the degree of integration is increased, a gap between circuits is narrowed. This easily increases coupling of signals between the circuits, that is, it easily deteriorates isolation between the circuits. In particular, increasing coupling between a transmission circuit and a reception circuit causes a transmission signal to flow into a reception circuit to generate characteristics deterioration, and is thus undesirable.

However, it has been found that there is a structural factor with the surface acoustic wave device described in Patent Document 1 that may damage isolation of signals between elements.

In view of the above-described matters, the present disclosure aims to provide a filter device in which a plurality of filters are arranged adjacently to each other to achieve good isolation of signals between the filters, and a high-frequency module and a communication device which use the filter device.

To achieve the above-described aim, a filter device according to an aspect of the present disclosure includes a first filter and a second filter arranged adjacently to each other. Each of the first filter and the second filter has one or more resonators, a plurality of terminal electrodes, and a plurality of wires connected to at least one terminal electrode out of the plurality of terminal electrodes. The first filter is arranged in a first filter region. The second filter is arranged in a second filter region. The first filter region and the second filter region are arranged adjacently to each other and have at least sides constituting a pair and opposing to each other. At least either one of the first filter region and the second filter region has no wire extending along one side opposing to another one of the first filter region and the second filter region in a forbidden region, which is present along and extending over the one side and has a width including a terminal electrode nearest to the one side.

The forbidden region is a region opposing to a filter adjacent thereto. Accordingly, when there is a wire extending along a side in the forbidden region, coupling is easily generated between adjacent filters through the wiring. By contrast, with the above-described configuration, at least one of adjacent filters has no wire extending along a side in the forbidden region. Therefore, coupling of signals is hard to be generated between the adjacent filters. Consequently, a filter device achieving good isolation of signals between filters may be provided.

Furthermore, the first filter may be formed of a first filter element, and the second filter may be formed of a second filter element different from the first filter element.

According to this configuration, each of the adjacent filters is formed of a separate filter element, enabling further improvement of isolation of signals between filters.

Furthermore, at least one terminal electrode in the forbidden region may not be connected to any of the resonators.

With this configuration, a terminal electrode that is not connected to any of the resonators is arranged and a distance between a signal line of the first filter and a signal line of the second filter is increased, enabling suppression of coupling of signals through a terminal electrode between the adjacent filters. Consequently, a filter device achieving good isolation of signals between filters may be provided.

Furthermore, the filter device may further include a third filter and a fourth filter arranged adjacently to each other. Each of the third filter and the fourth filter has one or more resonators, a plurality of terminal electrodes, and a plurality of wires connected to at least one terminal electrode out of the plurality of terminal electrodes. The third filter is arranged in a third filter region. The fourth filter is arranged in a fourth filter region. The third filter region and the fourth filter region are arranged adjacently to each other and have at least sides constituting a pair and opposing to each other. At least either one of the third filter region and the fourth filter region has no wire extending along the one side opposing to another one of the third filter region and the fourth filter region in a forbidden region, which is present along and extending over the one side and has a width including a terminal electrode nearest to the one side.

With this configuration, with two pairs of filters achieving good isolation of signals included, a filter device suitable for multiband communication and carrier aggregation communication may be provided.

Furthermore, a high-frequency module according to an aspect of the present disclosure includes the filter device and a switch connected to the filter device. Furthermore, a high-frequency module according to an aspect of the present disclosure includes the filter device and an amplifier connected to the filter device.

According to these configurations, a high-frequency module having good characteristics may be provided by using a filter device achieving good isolation of signals between filters.

Furthermore, a communication device according to an aspect of the disclosure includes a high-frequency module including the filter device and an RF signal processing circuit connected to the high-frequency module.

According to these configurations, by using a high-frequency module including a filter device that achieves good isolation of signals between filters, a communication device with high performance may be provided.

With a filter device according to the present disclosure, at least one of adjacent filters has no wire extending along a side opposing to the other filter in a forbidden region defined along the side. Accordingly, coupling of signals between the adjacent filters is hard to be generated. Consequently, a filter device achieving good isolation of signals between filters may be provided.

DETAILED DESCRIPTION OF THE DISCLOSURE

Hereinafter, embodiments of the present disclosure will be described in detail with reference to the drawings. It is to be noted that each of the embodiments described below represents a comprehensive or specific example. A numerical value, a shape, a material, a component, an arrangement and a connection form of components, or the like is an example and not a gist limiting the present disclosure. Out of the components in the embodiments below, a component not mentioned in an independent claim will be described as an optional component. Furthermore, a size or a size ratio of components illustrated in the drawings is not necessarily precise.

First Embodiment

A filter device according to a first embodiment includes a first filter and a second filter arranged adjacently to each other and has a characteristic structure for improving isolation of signals between filters.

Figure 1:
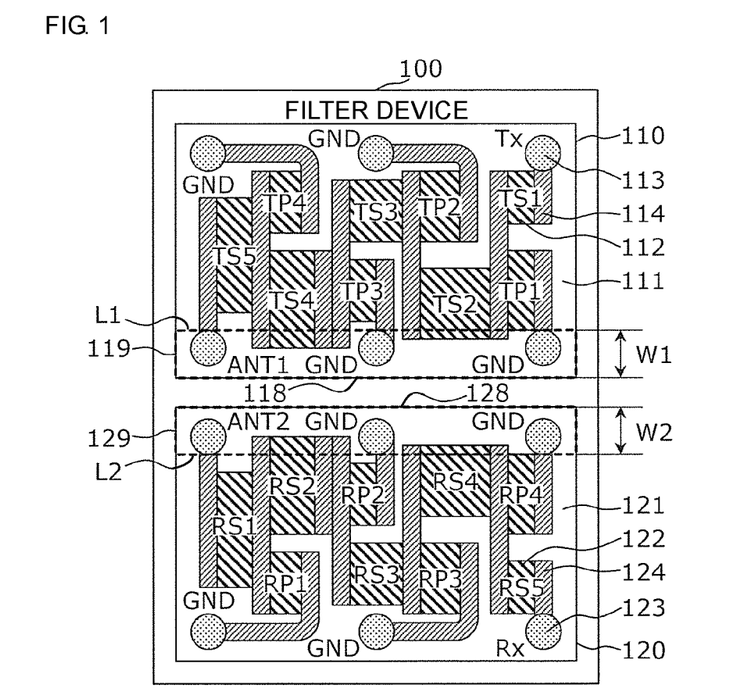
FIG. 1 is a schematic diagram illustrating an example of a planar structure of a filter device according to a first embodiment.

FIG. 1 is a schematic diagram illustrating an example of a planar structure of a filter device according to a first embodiment. In FIG. 1, similar components are depicted with the same pattern and the same signs are omitted as necessary.

As illustrated in FIG. 1, a filter device 100 includes a transmission filter 110 and a reception filter 120 which are arranged adjacently to each other. The transmission filter 110 and the reception filter 120 are examples of the first filter and the second filter, respectively.

The transmission filter 110 is configured to have one or more acoustic wave resonators 112, a plurality of terminal electrodes 113, and a plurality of wires 114 connected to at least one terminal electrode 113 out of the plurality of terminal electrodes 113 which are provided on or in a substrate 111. The reception filter 120 is configured to have one or more acoustic wave resonators 122, a plurality of terminal electrodes 123, and a plurality of wires 124 connected to at least one terminal electrode 123 out of the plurality of terminal electrodes 123 which are provided on or in a substrate 121. Each of the acoustic wave resonators 112 and 122 is an example of a resonator. In FIG. 1, to each of the acoustic wave resonators, an individual identification name is assigned.

A region in which the transmission filter 110 is arranged is a first filter region, and a region in which the reception filter 120 is arranged is a second filter region. In the description below, for the sake of convenience of reference, the same signs may be used for the filters and the regions in which the filters are arranged, and the expressions of the first filter region 110 and the second filter region 120 may be used. The first filter region 110 and the second filter region 120 are arranged adjacently to each other and have at least sides 118 and 128 constituting a pair and opposing to each other.

The transmission filter 110 and the reception filter 120 may be formed of separate chip components. In such a case, the first filter region 110 and the second filter region 120 are defined by contours of the corresponding chip components.

Furthermore, the transmission filter 110 and the reception filter 120 may be formed of a one-chip module. In such a case, the first filter region 110 and the second filter region 120 are defined by contours of the regions functioning as the transmission filter 110 and the reception filter 120 respectively in the module.

Figure 2:
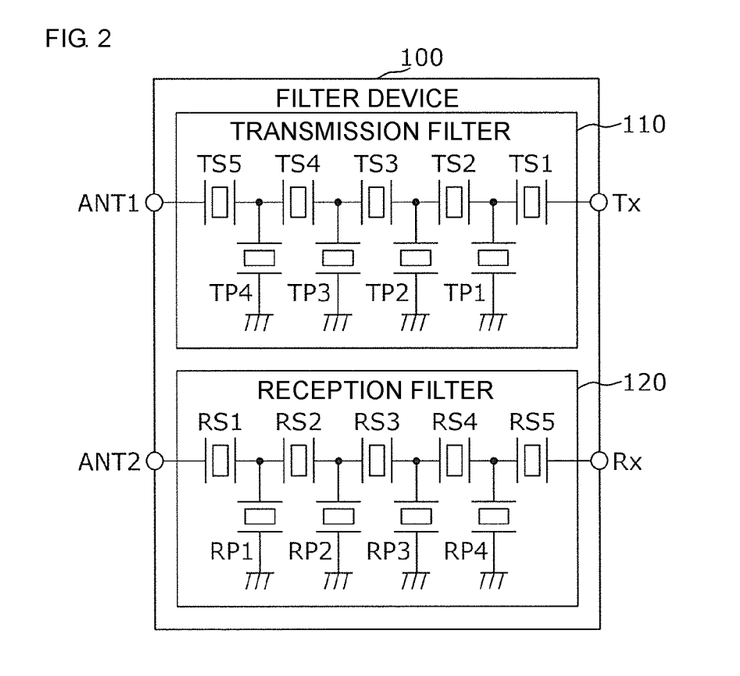
FIG. 2 is an equivalent circuit diagram of the filter device according to the first embodiment.

FIG. 2 is an equivalent circuit diagram of the filter device 100.

The transmission filter 110 is a ladder filter formed of five serial arm resonators TS1 to TS5 and four parallel arm resonators TP1 to TP4. The transmission filter 110 applies filter processing on a transmission RF signal supplied to a terminal electrode Tx and outputs the resultant signal from a terminal electrode ANT1.

The reception filter 120 is a ladder filter formed of five serial arm resonators RS1 to RS5 and four parallel arm resonators RP1 to RP4. The reception filter 120 applies filter processing on a reception RF signal supplied to a terminal electrode ANT2 and outputs the resultant signal from a terminal electrode Rx.

In FIG. 2, the acoustic wave resonators corresponding to those in FIG. 1 are denoted with the same identification names as those in FIG. 1.

With reference to FIG. 1 again, in the first filter region 110, a forbidden region 119 is present. The forbidden region 119 is a region present along the side 118 and extending over the side 118 of the first filter region 110, in which the side 118 opposes to the second filter region 120. The forbidden region 119 has a width W1 which includes terminal electrodes nearest to the side 118 (in the example in FIG. 1, the terminal electrode ANT1 and the two terminal electrodes GND). The forbidden region 119 specifically may be a region interposed between a line L1 that is parallel to the side 118 and passes the far ends of the terminal electrodes nearest to the side 118, and the side 118.

Furthermore, in the second filter region 120, a forbidden region 129 is present. The forbidden region 129 is a region present along the side 128 and extending over the side 128 of the second filter region 120, in which the side 128 opposes to the first filter region 110. The forbidden region 129 has a width W2 which includes terminal electrodes nearest to the side 128 (in the example in FIG. 1, the terminal electrode ANT2 and the two terminal electrodes GND). The forbidden region 129 specifically may be a region interposed between a line L2 that is parallel to the side 128 and passes the far ends of the terminal electrodes nearest to the side 128, and the side 128.

The first filter region 110 has no wire extending along the side 118 in the forbidden region 119. Having no wire extending along the side 118 here means that when there are wires in the forbidden region 119, all the wires are provided in the direction intersecting with the side 118. Similarly, the second filter region 120 has no wire extending along the side 128 in the forbidden region 129. Having no wire extending along the side 128 here means that when there are wires in the forbidden region 129, all the wires are provided in the direction intersecting with the side 128.

Effects of the filter device 100 achieved by the above-described structure will be described below based on the comparison with a comparison example.

Figure 3:
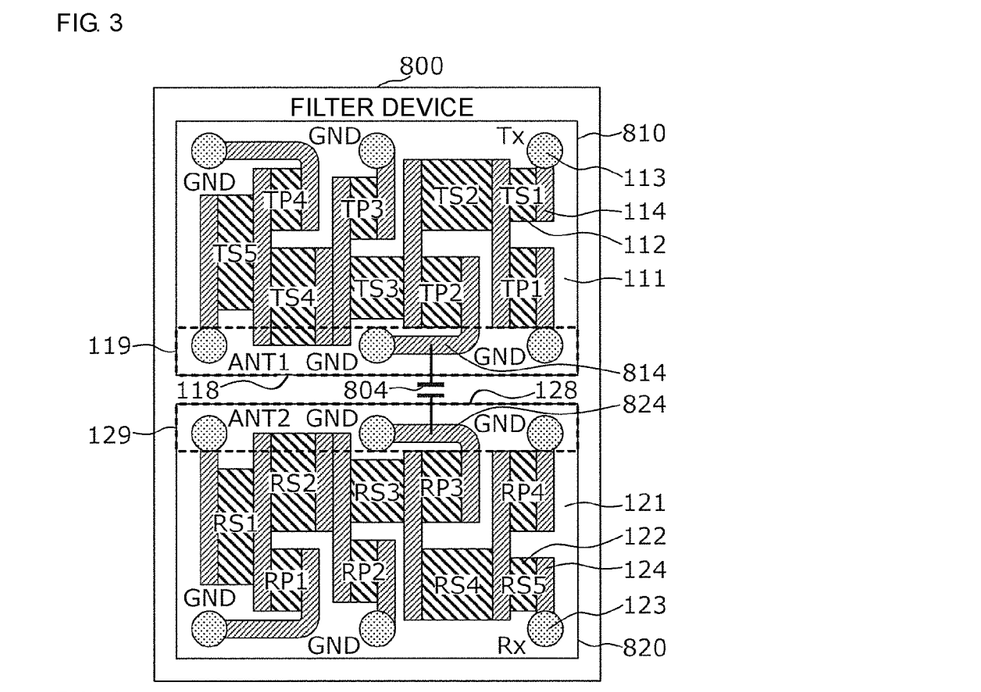
FIG. 3 is a schematic diagram illustrating an example of a planar structure of a filter device according to a comparison example.

FIG. 3 is a schematic diagram illustrating an example of a planar structure of a filter device according to the comparison example. In a filter device 800 illustrated in FIG. 3, in comparison to the filter device 100 in FIG. 1, the arrangement of the terminal electrode 113 and 123 and that of the forbidden regions 119 and 129 are the same, and the arrangement of some of the acoustic wave resonators 112 and 122 is different.

More specifically, in a transmission filter 810, in comparison to the transmission filter 110, the serial arm resonator TS2 and the parallel arm resonator TP2 are interchanged with each other, and the serial arm resonator TS3 and the parallel arm resonator TP3 are interchanged with each other. With this, to connect the parallel arm resonator TP2 to the terminal electrode GND located in the center of the side 118, a wire 814 extending along the side 118 is provided in the forbidden region 119.

Furthermore, in a reception filter 820, in comparison to the reception filter 120, the positions of the serial arm resonator RS3 and the parallel arm resonator RP2 are interchanged with each other, and the positions of the serial arm resonator RS4 and the parallel arm resonator RP3 are interchanged with each other. With this, to connect the parallel arm resonator RP3 to the terminal electrode GND located in the center of the side 128, a wire 824 extending along the side 128 is provided in the forbidden region 129.

Between the transmission filter 110 and the transmission filter 810, the corresponding acoustic wave resonators have the same shape, and thus, there is no significant difference in the bandpass characteristics. Between the reception filter 120 and the reception filter 820 also, for the same reason, it is assumed that there is no significant difference in the bandpass characteristics.

By contrast, the wires 814 and 824 extending along the sides 118 and 128 in the forbidden regions 119 and 129 oppose to each other at a short distance, easily forming a large parasitic capacitance 804. When the parasitic capacitance 804 is formed, between the transmission filter 810 and the reception filter 820, coupling of signals is generated by leakage of signals through the parasitic capacitance 804, deteriorating isolation of signals.

In view of the above-described matters, the present inventors point out that the structure, in which in forbidden regions of adjacent two filter regions, that is, in regions having widths that include terminal electrodes nearest to the sides opposing to each other in the two filter regions, wires are provided extending along the sides opposing to each other, causes deterioration of isolation of signals between the elements. Such a structure is found in the surface acoustic wave device disclosed in Patent Document 1, for example.

In the above-described filter devices 100 and 800, the characteristics described below have been confirmed specifically. An example and the comparison example described below correspond to the filter devices 100 and 800, respectively.

Figure 4:
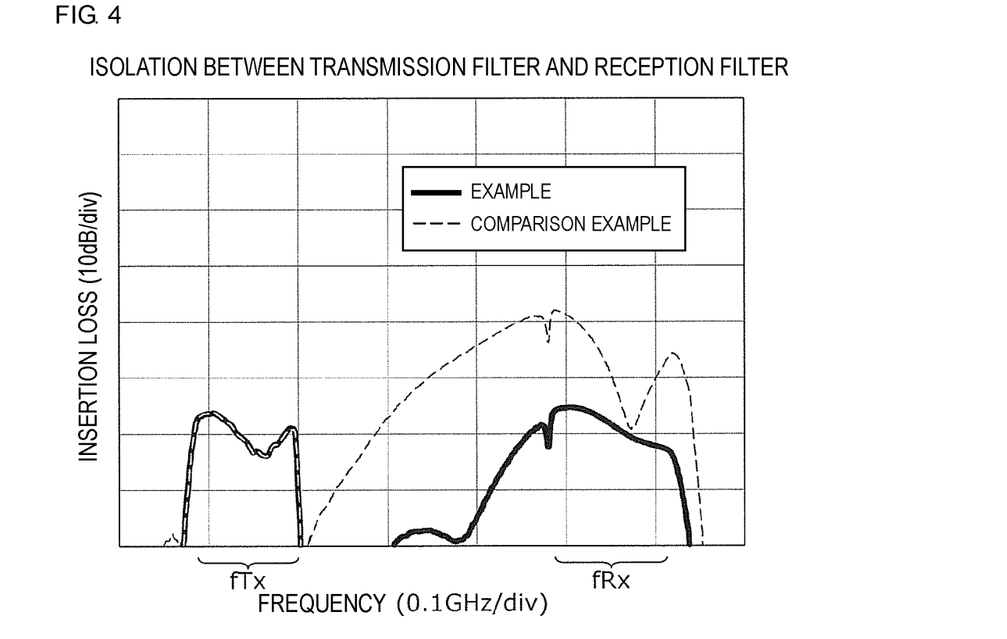
FIG. 4 is a graph illustrating an example of isolation characteristics between a transmission filter and a reception filter.

FIG. 4 is a graph illustrating an example of an insertion loss from a transmission filter to a reception filter. The vertical axis represents an insertion loss and one unit of scale represents 10 dB. The lower part of the graph indicates larger insertion loss. The horizontal axis represents frequency and one unit of scale represents 0.1 GHz. fTx and fRx on the horizontal axis represent a transmission frequency band and a reception frequency band, respectively. FIG. 4 represents isolation characteristics between the transmission filter and the reception filter.

As can be seen in FIG. 4, in the example, the insertion loss, that is, isolation of signals in the reception frequency band is increased by approximately 15 dB at the maximum, in comparison to the comparison example.

Figure 5:
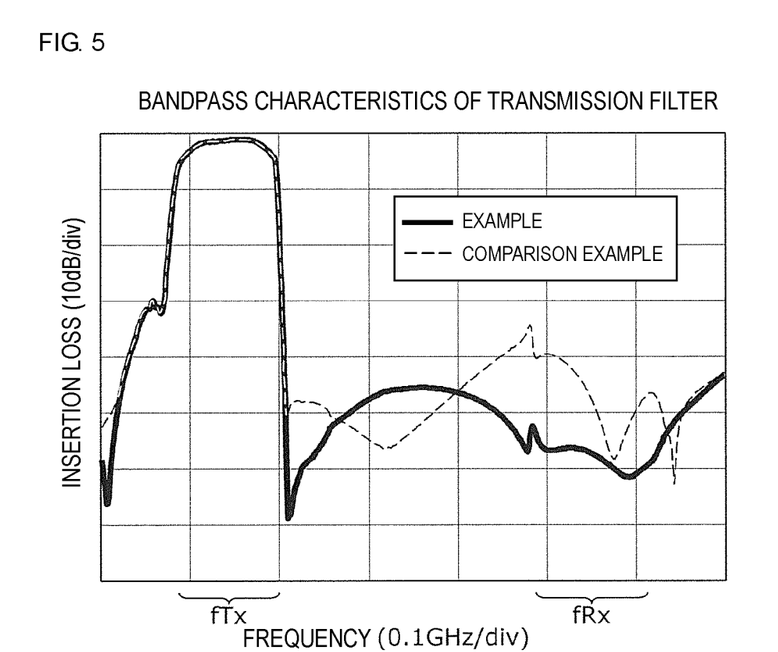
FIG. 5 is a graph illustrating an example of bandpass characteristics of the transmission filter.

FIG. 5 is a graph illustrating an example of the insertion loss of the transmission filter.

Figure 6:
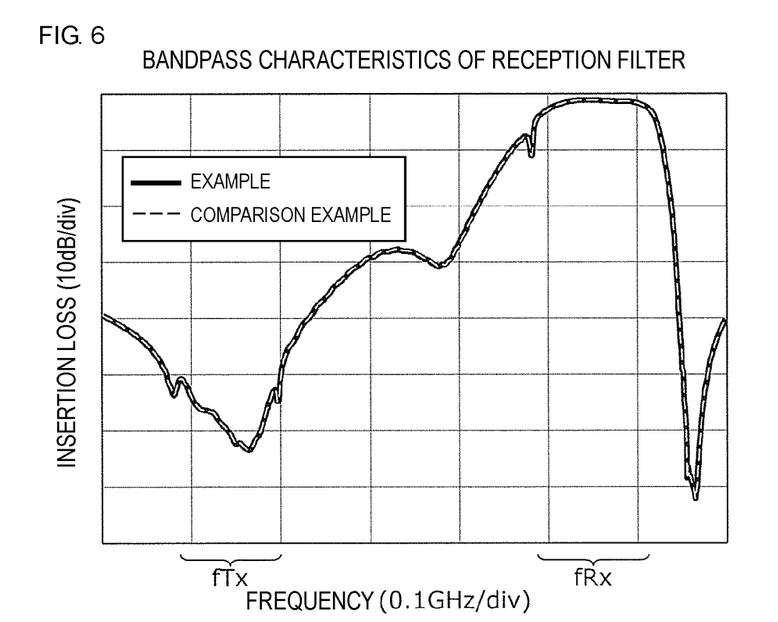
FIG. 6 is a graph illustrating an example of bandpass characteristics of the reception filter.

FIG. 6 is a graph illustrating an example of insertion loss of the reception filter.

In the graphs in FIGS. 5 and 6, the same notation method as in FIG. 4 is used, and thus the explanation thereof will be omitted. FIGS. 5 and 6 illustrate bandpass characteristics of the transmission filter and the reception filter, respectively.

As can be seen in FIGS. 5 and 6, between the example and the comparison example, the insertion losses, that is, the bandpass characteristics of signals of the transmission filter in the transmission frequency band are almost the same. Furthermore, the insertion loss, that is, the bandpass characteristics of signals of the reception filter in the reception frequency band are almost the same, too.

This result has demonstrated that not providing the wires 814 and 824 extending along the sides 118 and 128 in the forbidden regions 119 and 129 enables achievement of good isolation between the transmission filter and the reception filter, without deteriorating the bandpass characteristics of the transmission filter and the reception filter.

As described above, in the filter device 100, neither the transmission filter 110 nor the reception filter 120 has a wire extending along the side 118 or 128 in the forbidden region 119 or 129. With this characteristic structure, the filter device 100 achieving good isolation of signals between the filters may be provided.

It is to be noted that either one of the transmission filter 110 or the reception filter 120 may have a wire extending along the side in the forbidden region. In this case also, isolation is improved in comparison to a case where there are wires extending along the sides in both of the forbidden regions of the transmission filter 110 and the reception filter 120 and a large parasitic capacitance is formed.

Second Embodiment

A filter device according to a second embodiment is different from the filter device according to the first embodiment in that at least one terminal electrode in the forbidden region is not connected to any of the acoustic wave resonators. In the description below, the explanations of the same matters as in the first embodiment will be omitted, and matters different in the second embodiment will be mainly explained.

Figure 7:
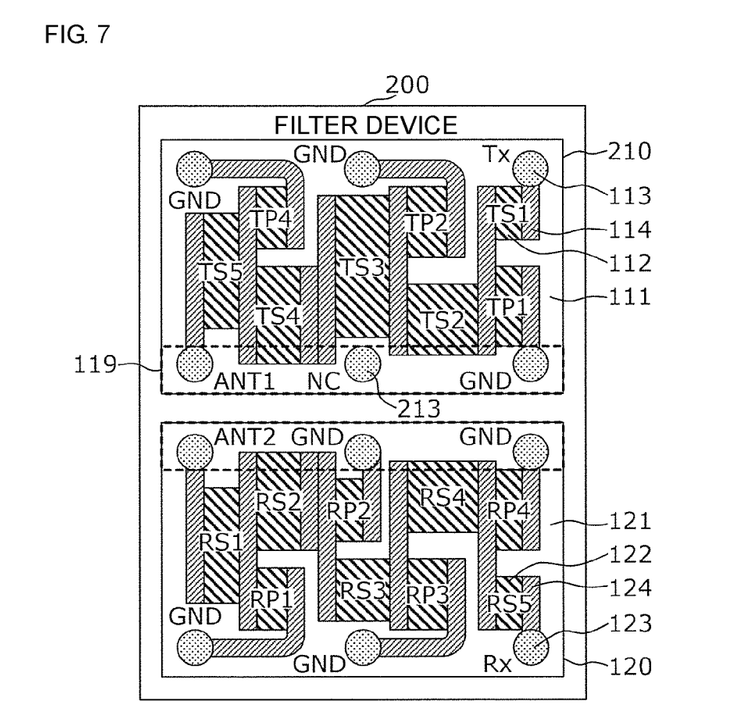
FIG. 7 is a schematic diagram illustrating an example of a planar structure of a filter device according to a second embodiment.

FIG. 7 is a schematic diagram illustrating an example of a planar structure of the filter device according to the second embodiment. In a filter device 200 illustrated in FIG. 7, a transmission filter 210 has been changed, in comparison to the filter device 100 in FIG. 1.

More specifically, in the transmission filter 210, the parallel arm resonator TP3 is omitted, in comparison to the transmission filter 110. Furthermore, the terminal electrode located in the center of the forbidden region 119 is changed to a terminal electrode 213 which is not connected to any of the acoustic wave resonator 112, in the same position as the terminal electrode GND corresponding thereto in the transmission filter 110. Other terminal electrodes 113 are not changed.

The filter device 200 may be adopted to achieve the desired characteristics of the transmission filter 210 when no parallel arm resonator has to be connected to a connection point of the serial arm resonators TS3 and TS4, for example. With the filter device 200, the terminal electrode 213 which is not connected to any of the acoustic wave resonators 112 is arranged in the forbidden region 119 and the distance between the signal line of the transmission filter 210 and the signal line of the reception filter 120 is increased, and coupling of signals is thereby suppressed. Consequently, a filter device achieving good isolation of signals between the filters may be provided.

Third Embodiment

A filter device according to a third embodiment is configured to have a third filter and a fourth filter in addition to the filter device according to the first embodiment. In the description below, the explanations of the same matters as in the first embodiment will be omitted, and matters different in the third embodiment will be mainly explained.

Figure 8:
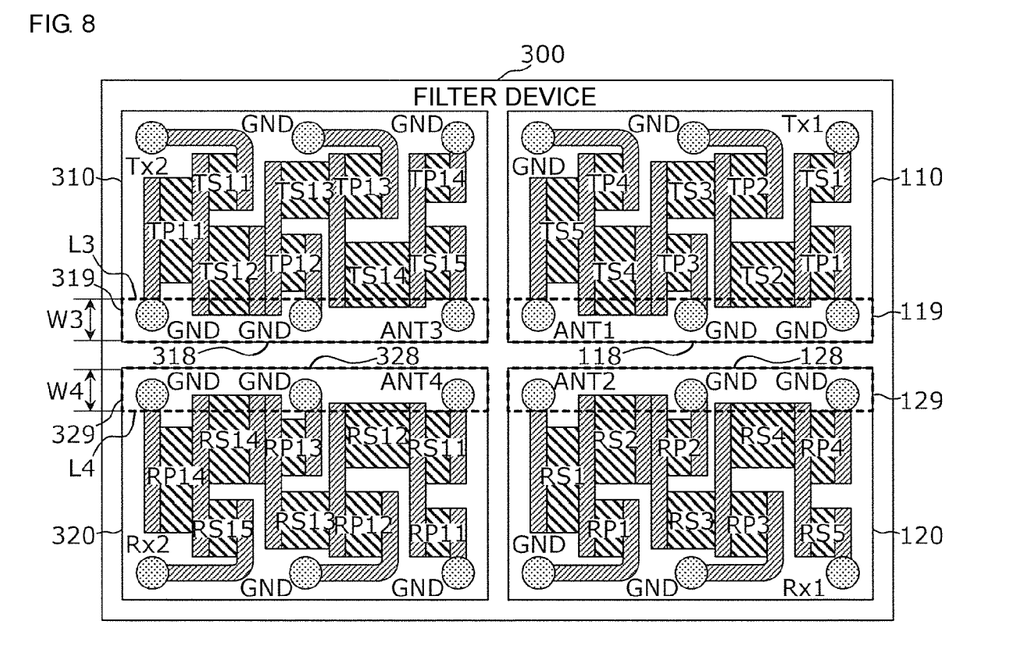
FIG. 8 is a schematic diagram illustrating an example of a planar structure of a filter device according to a third embodiment.

FIG. 8 is a schematic diagram illustrating an example of a planar structure of a filter device according to a third embodiment. A filter device 300 illustrated in FIG. 8 is configured to have a transmission filter 310 and a reception filter 320 in addition to the filter device 100 in FIG. 1. The transmission filter 310 and the reception filter 320 are examples of a third filter and a fourth filter, respectively.

In FIG. 8, acoustic wave resonators, terminal electrodes, and wires are illustrated with the same patterns as in FIG. 1, and the reference signs are omitted as appropriate. To each of the acoustic wave resonators, an individual identification name is assigned.

The region in which the transmission filter 310 is arranged is a third filter region, and the region in which the reception filter 320 is arranged is a fourth filter region. In the description below, for the sake of convenience of reference, the same signs may be used for the filters and the regions in which the filters are arranged, and the expressions of the third filter region 310 and the fourth filter region 320 may be used. The third filter region 310 and the fourth filter region 320 are arranged adjacently to each other and have at least sides 318 and 328 constituting a pair and opposing to each other.

The transmission filter 310 and the reception filter 320 may be formed of separate chip components. In such a case, the third filter region 310 and the fourth filter region 320 are defined by contours of the corresponding chip components.

Furthermore, the transmission filter 310 and the reception filter 320 may be formed of a one-chip module. In such a case, the third filter region 310 and the fourth filter region 420 are defined by contours of the regions functioning as the transmission filter 310 and the reception filter 320 respectively in the module.

Figure 9:
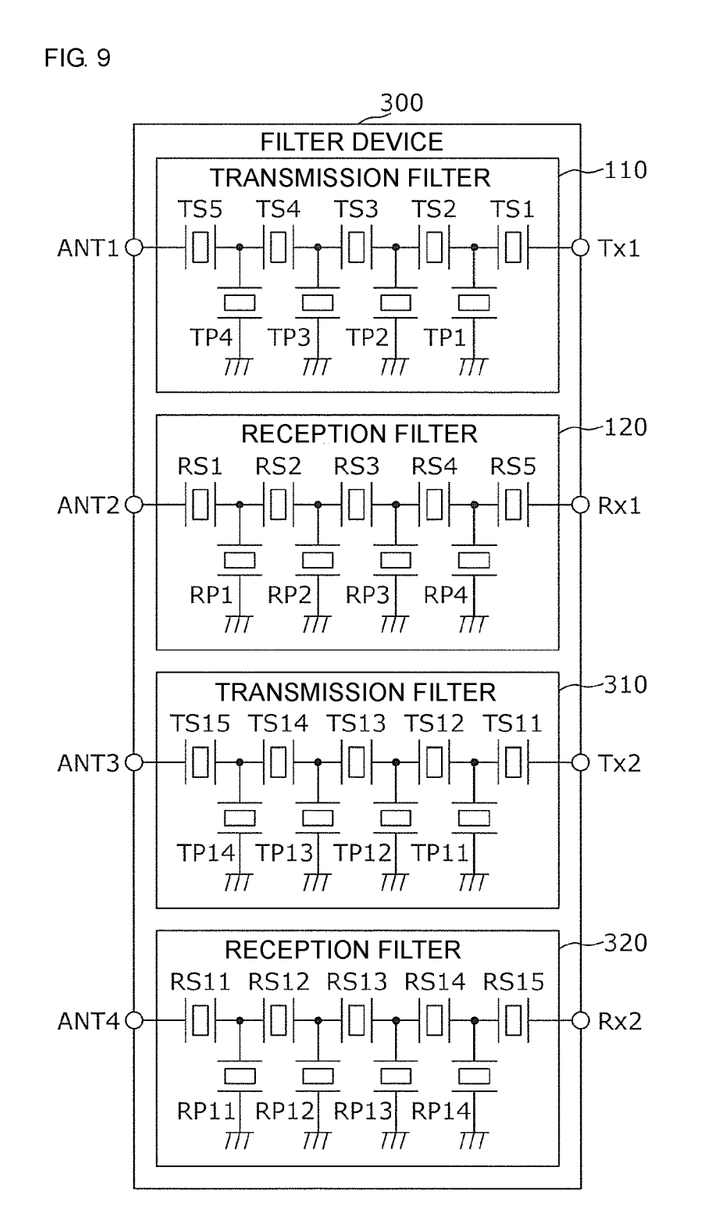
FIG. 9 is an equivalent circuit diagram of the filter device according to the third embodiment.

FIG. 9 is an equivalent circuit diagram of the filter device 300. In the equivalent circuit diagram of the filter device 300 illustrated in FIG. 9, the transmission filter 310 and the reception filter 320 are added to the equivalent circuit diagram of the filter device 100 in FIG. 2.

The transmission filter 310 is a ladder filter formed of five serial arm resonators TS11 to TS15 and four parallel arm resonators TP11 to TP14. The transmission filter 310 applies filter processing on a transmission RF signal supplied to a terminal electrode Tx2 and outputs the resultant signal from a terminal electrode ANT3.

The reception filter 320 is a ladder filter formed of five serial arm resonators RS11 to RS15 and four parallel arm resonators RP11 to RP14. The reception filter 320 applies filter processing on a reception RF signal supplied to a terminal electrode ANT4 and outputs the resultant signal from a terminal electrode Rx2.

In FIG. 9, the acoustic wave resonators corresponding to those in FIG. 8 are denoted with the same identification names as those in FIG. 8.

With reference to FIG. 8 again, in the third filter region 310, a forbidden region 319 is defined. The forbidden region 319 is a region present along the side 318 and extending over the side 318 of the third filter region 310, in which the side 318 opposes to the fourth filter region 320. The forbidden region 319 has a width W3 which includes terminal electrodes (in the example in FIG. 8, the terminal electrode ANT3 and the two terminal electrodes GND) nearest to the side 318. The forbidden region 319 specifically may be a region interposed between a line L3 that is parallel to the side 318 and passes the far ends of the terminal electrodes nearest to the side 318, and the side 318.

Furthermore, in the fourth filter region 320, a forbidden region 329 is defined. The forbidden region 329 is a region present along the side 328 and extending over the side 328 of the fourth filter region 320, in which the side 328 opposes to the third filter region 310. The forbidden region 329 has a width W4 which includes terminal electrodes (in the example in FIG. 8, the terminal electrode ANT4 and the two terminal electrodes GND) nearest to the side 328. The forbidden region 329 specifically may be a region interposed between a line L4 that is parallel to the side 328 and passes the far ends of the terminal electrodes nearest to the side 328, and the side 328.

The transmission filter 310 has no wire extending along the side 318 in the forbidden region 319. Having no wire extending along the side 318 here means that when there are wires in the forbidden region 319, all the wires are provided in the direction intersecting with the side 318. Similarly, the reception filter 320 has no wire extending along the side 328 in the forbidden region 329. Having no wire extending along the side 328 here means that when there are wires in the forbidden region 329, all the wires are provided in the direction intersecting with the side 328.

With this configuration, with two pairs of a transmission filter and a reception filter achieving good isolation of signals included, the filter device 300 suitable for multiband communication and carrier aggregation communication may be provided.

Fourth Embodiment

In a fourth embodiment, a high-frequency module including a filter device will be described based on two examples.

Figure 10:
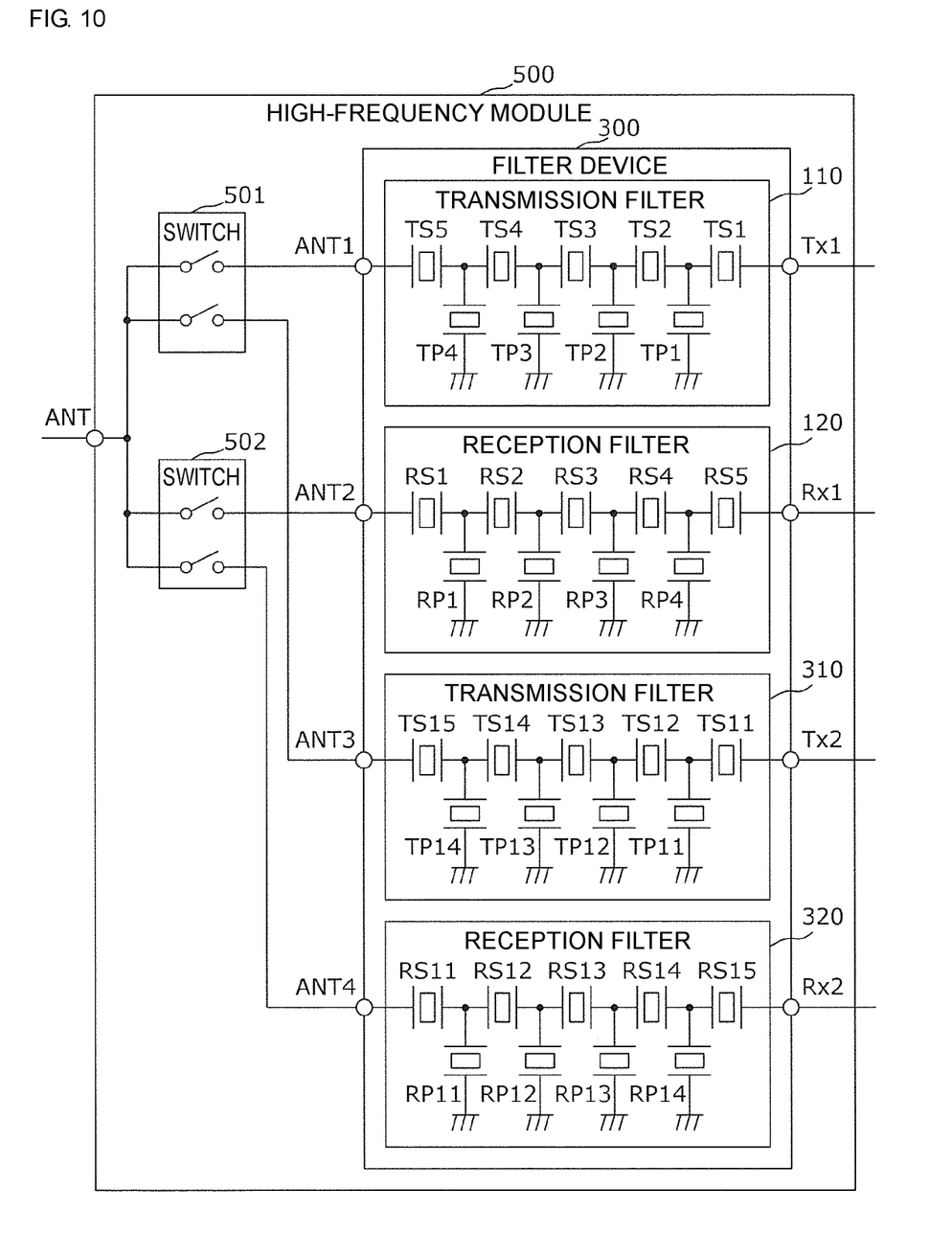
FIG. 10 is a block diagram illustrating an example of a functional configuration of a high-frequency module according to a fourth embodiment.

FIG. 10 is a block diagram illustrating an example of a functional configuration of a first high-frequency module according to a fourth embodiment. As illustrated in FIG. 10, a high-frequency module 500 includes the filter device 300 and switches 501 and 502.

In the filter device 300, a filter device 300 according to the third embodiment may be used. The planar structure of the filter device 300 is as illustrated in FIG. 8.

The switch 501 independently controls connection between the terminal electrode ANT1 of the filter device 300 and a common antenna terminal ANT, and connection between the terminal electrode ANT3 of the filter device 300 and the common antenna terminal ANT, in accordance with a control signal which is not illustrated. The switch 501 is capable of simultaneously establishing connection between the terminal electrode ANT1 and the common antenna terminal ANT, and connection between the terminal electrode ANT3 and the common antenna terminal ANT.

The switch 502 independently controls connection between the common antenna terminal ANT and the terminal electrode ANT2 of the filter device 300, and connection between the common antenna terminal ANT and the terminal electrode ANT4 of the filter device 300, in accordance with a control signal which is not illustrated. The switch 502 is capable of simultaneously establishing connection between the common antenna terminal ANT and the terminal electrode ANT2, and connection between the common antenna terminal ANT and the terminal electrode ANT4.

With this, the high-frequency module 500 switches the switches 501 and 502, enabling processing of transmission RF signals Tx1 and Tx2 and reception RF signals Rx1 and Rx2 using optional combinations including a combination corresponding to carrier aggregation processing. The high-frequency module 500 is capable of processing signals using the following combination, for example.

The transmission RF signal Tx1 and the reception RF signal Rx1 (transmission and reception in different spectrums in the same band)

The transmission RF signal Tx2 and the reception RF signal Rx2 (transmission and reception in different spectrums in the same band)

The transmission RF signal Tx1 and the reception RF signal Rx1, and the transmission RF signal Tx2 and the reception RF signal Rx2 (simultaneous transmission and reception processing in two bands, which is called two uplink communication)

The transmission RF signal Tx1 and two reception RF signals Rx1 and Rx2 (which is called two downlink communication)

The transmission RF signal Tx2 and two reception RF signals Rx1 and Rx2 (which is called two downlink communication)

This configuration enables the high-frequency module 500 to be provided suitable for multiband communication and carrier aggregation communication that are capable of processing two transmission RF signals and two reception RF signals in parallel while maintaining good isolation and using a desired combination.

Figure 11:
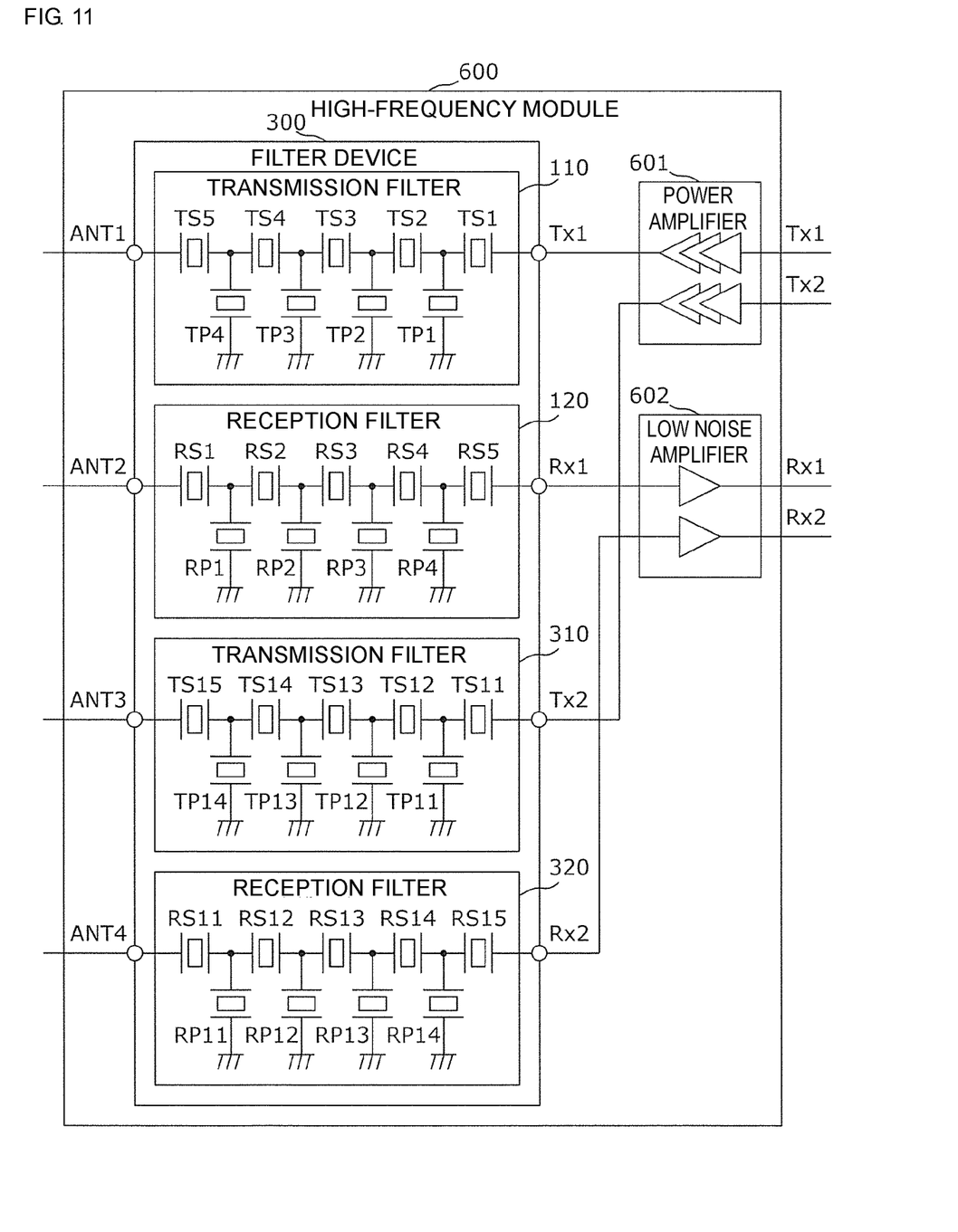
FIG. 11 is a block diagram illustrating an example of a functional configuration of a high-frequency module according to the fourth embodiment.

FIG. 11 is a block diagram illustrating an example of a functional configuration of a second high-frequency module according to the fourth embodiment. As illustrated in FIG. 11, a high-frequency module 600 includes the filter device 300, a power amplifier 601, and a low noise amplifier 602.

For the filter device 300, the filter device 300 according to the third embodiment may be used. The planar structure of the filter device 300 is as illustrated in FIG. 8.

The power amplifier 601 has a plurality of semiconductor elements and is capable of amplifying the two transmission RF signals Tx1 and Tx2 in parallel and supplying the resultant signals to the filter device 300.

The low noise amplifier 602 has a plurality of semiconductor elements and is capable of amplifying the two reception RF signals Rx1 and Rx2 that have been supplied from the filter device 300 in parallel.

This configuration enables the high-frequency module 600 to be provided suitable for multiband communication and carrier aggregation communication that are capable of processing two pairs of transmission RF signals and reception RF signals in parallel while maintaining good isolation.

Fifth Embodiment

In a fifth embodiment, a communication device including a filter device will be described.

Figure 12:
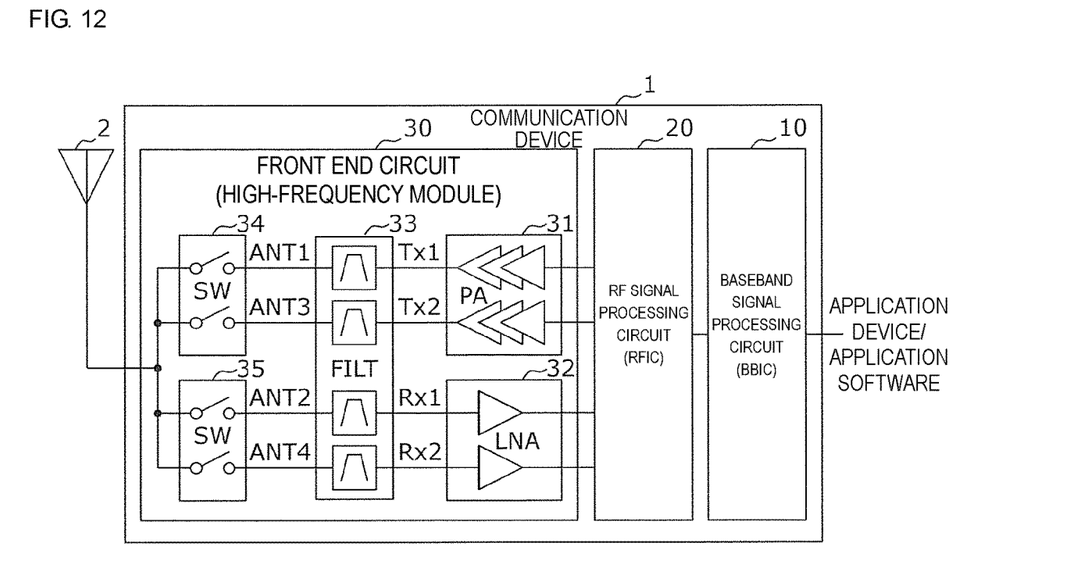
FIG. 12 is a block diagram illustrating an example of a functional configuration of a communication device according to a fifth embodiment.

FIG. 12 is a block diagram illustrating an example of a functional configuration of a communication device 1 according to the fifth embodiment. As illustrated in FIG. 12, the communication device 1 includes a baseband signal processing circuit 10, an RF signal processing circuit 20, and a front end circuit 30.

The baseband signal processing circuit 10 converts transmission data generated using an application device/application software that performs voice communication, image display, and the like into a transmission signal and supplies the transmission signal to the RF signal processing circuit 20. This conversion may include compression and multiplexing of data and addition of an error correction code to data. Furthermore, the baseband signal processing circuit 10 converts a reception signal received from the RF signal processing circuit 20 into reception data and supplies the reception data to the application device/application software. This conversion may include decompression, demultiplexing, and error correction of data. The baseband signal processing circuit 10 may be formed of a baseband integrated circuit (BBIC).

The RF signal processing circuit 20 converts transmission signals received from the baseband signal processing circuit 10 into the transmission RF signals Tx1 and Tx2 and supplies the transmission signals to the front end circuit 30. This conversion may include modulation and upconversion of signals. Furthermore, the RF signal processing circuit 20 converts the reception RF signals Rx1 and Rx2 received from the front end circuit 30 into reception signals and supplies the reception signals to the baseband signal processing circuit 10. This conversion may include demodulation and downconversion of signals. The RF signal processing circuit 20 may be formed of a high-frequency integrated circuit (RFIC).

The front end circuit 30 has a power amplifier (PA) 31, a low noise amplifier (LNA) 32, a filter device (FILT) 33, and switches (SW) 34 and 35. For the filter device 33, the filter device 300 according to the third embodiment may be used. A part of the front end circuit 30 may be formed of the high-frequency module 500 or the high-frequency module 600 according to the fourth embodiment.

The power amplifier 31 amplifies the transmission RF signals Tx1 and Tx2 for each frequency band that have been received from the RF signal processing circuit 20 and supplies the amplified signals to the filter device 33.

The low noise amplifier 32 amplifies the reception RF signals Rx1 and Rx2 for each frequency band that have been received from the filter device 33 and supplies the amplified signals to the RF signal processing circuit 20.

The filter device 33 applies filter processing, for example, bandpass processing on each of the transmission RF signals Tx1 and Tx2a and the reception RF signals Rx1 and Rx2.

The switch 34 connects an antenna 2 and signal paths corresponding to the frequency bands used in an actual transmission operation. In particular, in carrier aggregation communication that uses two frequency bands simultaneously to perform a transmission operation, the switch 34 connects both of the two signal paths connected to the power amplifier 31 to the antenna 2.

The switch 35 connects the antenna 2 and signal paths corresponding to the frequency bands used in an actual reception operation. In particular, in carrier aggregation communication that uses two frequency bands simultaneously to perform a reception operation, the switch 35 connects the antenna 2 to both of the two signal paths connected to the low noise amplifier 32.

According to the communication device 1, for the filter device 33, a filter device capable of processing two pairs of transmission RF signals and reception RF signals in parallel while maintaining good isolation is used, whereby a high-performance communication device 1 suitable for multiband communication and carrier aggregation communication is provided.

A high-frequency module and a communication device according to the embodiments of the present disclosure have been described above. However, the present disclosure is not limited to the individual embodiment. Forms in which various modifications that the skilled person may think of are adopted into the above-described embodiments or the components in the different embodiments are combined may be included in the scope of one or a plurality of aspects of the present disclosure unless the forms do not depart from the spirit of the disclosure.

For example, an acoustic wave filter device may be a surface acoustic wave (SAW) filter or a bulk acoustic wave (BAW) filter.

The SAW filter includes a substrate and an interdigital transducer (IDT) electrode.

The substrate is a substrate of which at least a surface has piezoelectricity. For example, the substrate may include a piezoelectric thin film on a surface, and be formed of a multilayer body composed of a film having an acoustic velocity different from that of the piezoelectric thin film, a support substrate, and the like. Furthermore, the substrate may have piezoelectricity over the whole of the substrate. In such a case, the substrate is a piezoelectric substrate formed of one layer of a piezoelectric substance.

Furthermore, the acoustic wave filter device is not limited to a ladder filter, and may be a vertically coupled filter device.

The present disclosure may be utilized in various communication devices as a filter device and a high-frequency module including a filter device.

1 communication device
2 antenna
10 baseband signal processing circuit
20 RF signal processing circuit
30 front end circuit
31, 601 power amplifier
32, 602 low noise amplifier
33 filter device
34, 35, 501, 502 switch
100, 200, 300, 800 filter device
110, 210, 310, 810 transmission filter
111, 121 substrate
112, 122 acoustic wave resonator
113, 123, 213 terminal electrode
114, 124, 814, 824 wire
118, 128, 218, 228 side
119, 129, 319, 329 forbidden region
120, 320, 820 reception filter
500, 600 high-frequency module
804 parasitic capacitance

The invention claimed is:

1. A filter device comprising:
a first filter and a second filter arranged adjacently to each other, wherein
each of the first filter and the second filter has one or more resonators, a plurality of terminal electrodes, and a plurality of wires connected to at least one terminal electrode out of the plurality of terminal electrodes,
the first filter is arranged in a first filter region, the second filter is arranged in a second filter region, and the first filter region and the second filter region are arranged adjacently to each other and have at least one pair of sides opposing to each other, and
one or both of the first filter region and the second filter region has a forbidden region, wherein the forbidden region is present along and extended over one side of the pair of sides, and has a width large enough to include a terminal electrode nearest to the one side among the plurality of terminal electrodes, wherein no wire present in the forbidden region extends in a direction along a length of the one side.

2. The filter device according to claim 1, wherein
the first filter comprises a first filter element, and
the second filter comprises a second filter element different from the first filter element.

3. The filter device according to claim 1, wherein
at least one terminal electrode in the forbidden region is not connected to any of the resonators.

4. The filter device according to claim 1, further comprising
a third filter and a fourth filter arranged adjacently to each other, wherein
each of the third filter and the fourth filter has one or more second resonators, a plurality of second terminal electrodes, and a plurality of second wires connected to at least one second terminal electrode out of the plurality of second terminal electrodes,
the third filter is arranged in a third filter region, the fourth filter is arranged in a fourth filter region, and the third filter region and the fourth filter region are arranged adjacently to each other and have at least a second pair of sides opposing to each other, and
one or both of the third filter region and the fourth filter region has a second forbidden region, wherein the second forbidden region is present along and extended over a second one side of the second pair of sides, and has a width large enough to include a terminal electrode nearest to the second one side among the plurality of second terminal electrodes, wherein no wire extending along the second one side is present in the second forbidden region.

5. A high-frequency module comprising:
the filter device according to claim 1; and
a switch connected to the filter device.

6. A high-frequency module comprising:
the filter device according to claim 1; and
an amplifier connected to the filter device.

7. A communication device comprising:
- a high-frequency module including the filter device according to claim 1; and
- a radio frequency signal processing circuit connected to the high-frequency module.

8. The filter device according to claim 2, wherein at least one terminal electrode in the forbidden region is not connected to any of the resonators.

9. The filter device according to claim 2, further comprising
- a third filter and a fourth filter arranged adjacently to each other, wherein
- each of the third filter and the fourth filter has one or more second resonators, a plurality of second terminal electrodes, and a plurality of second wires connected to at least one second terminal electrode out of the plurality of second terminal electrodes,
- the third filter is arranged in a third filter region, the fourth filter is arranged in a fourth filter region, and the third filter region and the fourth filter region are arranged adjacently to each other and have at least a second pair of sides opposing to each other, and
- one or both of the third filter region and the fourth filter region has a second forbidden region, wherein the second forbidden region is present along and extended over a second one side of the second pair of sides, and has a width large enough to include a terminal electrode nearest to the second one side among the plurality of second terminal electrodes, wherein no wire extending along the second one side is present in the second forbidden region.

10. The filter device according to claim 3, further comprising
- a third filter and a fourth filter arranged adjacently to each other, wherein
- each of the third filter and the fourth filter has one or more second resonators, a plurality of second terminal electrodes, and a plurality of second wires connected to at least one second terminal electrode out of the plurality of second terminal electrodes,
- the third filter is arranged in a third filter region, the fourth filter is arranged in a fourth filter region, and the third filter region and the fourth filter region are arranged adjacently to each other and have at least a second pair of sides opposing to each other, and
- one or both of the third filter region and the fourth filter region has a second forbidden region, wherein the second forbidden region is present along and extended over a second one side of the second pair of sides, and has a width large enough to include a terminal electrode nearest to the second one side among the plurality of second terminal electrodes, wherein no wire extending along the second one side is present in the second forbidden region.

11. A high-frequency module comprising:
the filter device according to claim 2; and
a switch connected to the filter device.

12. A high-frequency module comprising:
the filter device according to claim 3; and
a switch connected to the filter device.

13. A high-frequency module comprising:
the filter device according to claim 4; and
a switch connected to the filter device.

14. A high-frequency module comprising:
the filter device according to claim 2; and
an amplifier connected to the filter device.

15. A high-frequency module comprising:
the filter device according to claim 3; and
an amplifier connected to the filter device.

16. A high-frequency module comprising:
the filter device according to claim 4; and
an amplifier connected to the filter device.

17. A communication device comprising:
- a high-frequency module including the filter device according to claim 2; and
- a radio frequency signal processing circuit connected to the high-frequency module.

18. A communication device comprising:
- a high-frequency module including the filter device according to claim 3; and
- a radio frequency signal processing circuit connected to the high-frequency module.

19. A communication device comprising:
- a high-frequency module including the filter device according to claim 4; and
- a radio frequency signal processing circuit connected to the high-frequency module.

* * * * *